(12) United States Patent
Choi et al.

(10) Patent No.: US 11,139,454 B2
(45) Date of Patent: Oct. 5, 2021

(54) DISPLAY APPARATUS AND METHOD OF MANUFACTURING THE SAME

(71) Applicant: SAMSUNG DISPLAY CO., LTD., Yongin-si (KR)

(72) Inventors: Yoonsun Choi, Yongin-si (KR); Hyunchul Kim, Yongin-si (KR); Wonsuk Choi, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/687,578

(22) Filed: Nov. 18, 2019

(65) Prior Publication Data

US 2020/0091461 A1    Mar. 19, 2020

Related U.S. Application Data

(63) Continuation of application No. 15/417,000, filed on Jan. 26, 2017, now Pat. No. 10,483,491.

(30) Foreign Application Priority Data

Mar. 11, 2016   (KR) .................. 10-2016-0029696

(51) Int. Cl.
*H01L 51/00* (2006.01)
*H01L 51/52* (2006.01)
(Continued)

(52) U.S. Cl.
CPC .... *H01L 51/5253* (2013.01); *G02F 1/133305* (2013.01); *G02F 1/133351* (2013.01);
(Continued)

(58) Field of Classification Search
CPC .................................................. H01L 51/5253
See application file for complete search history.

(56) References Cited

U.S. PATENT DOCUMENTS

| 8,698,179 B2 | 4/2014 | Cho et al. |
| 9,029,846 B2 | 5/2015 | Song et al. |

(Continued)

FOREIGN PATENT DOCUMENTS

| CN | 103680319 A | 3/2014 |
| CN | 103682148 A | 3/2014 |

(Continued)

OTHER PUBLICATIONS

EPO Extended Search Report dated Nov. 29, 2017, for corresponding European Patent Application No. 17160192.5 (15 pages).

(Continued)

*Primary Examiner* — Grant S Withers
(74) *Attorney, Agent, or Firm* — Lewis Roca Rothgerber Christie LLP

(57) ABSTRACT

A method of manufacturing a display apparatus that is capable of reducing manufacturing costs and a defect rate during manufacturing, and a display apparatus. The method includes forming a plurality of display units over a mother substrate; attaching a temporary protective film to a lower surface of the mother substrate; cutting the mother substrate and the temporary protective film along a periphery of each of the plurality of display units to obtain a plurality of display panels, each including a first area, a second area, and a bent area between the first area and the second area; removing the temporary protective film from the plurality of display panels; and attaching a lower protective film to a lower surface of each of the plurality of display panels so as to correspond to the first area in each display panel.

22 Claims, 10 Drawing Sheets

(51) Int. Cl.
*G02F 1/1333* (2006.01)
*H01L 27/32* (2006.01)

(52) U.S. Cl.
CPC ........ *H01L 51/003* (2013.01); *H01L 51/0097* (2013.01); *H01L 51/524* (2013.01); *G02F 1/133311* (2021.01); *H01L 27/3244* (2013.01); *H01L 2227/323* (2013.01); *H01L 2227/326* (2013.01); *H01L 2251/566* (2013.01); *Y02E 10/549* (2013.01)

(56) References Cited

U.S. PATENT DOCUMENTS

| | | | |
|---|---|---|---|
| 9,066,380 B2 | 6/2015 | Cho et al. | |
| 9,189,027 B2 | 11/2015 | Lee et al. | |
| 9,285,835 B2 | 3/2016 | Lee et al. | |
| 9,287,329 B1 | 3/2016 | Lee et al. | |
| 9,293,731 B2 | 3/2016 | Kim et al. | |
| 9,351,417 B2 | 5/2016 | Park et al. | |
| 2013/0113734 A1 | 5/2013 | Cho et al. | |
| 2013/0257696 A1 | 10/2013 | Ha et al. | |
| 2014/0042406 A1 | 2/2014 | Degner et al. | |
| 2014/0061610 A1 | 3/2014 | Mun et al. | |
| 2014/0078104 A1 | 3/2014 | Lee et al. | |
| 2014/0198267 A1 | 7/2014 | Jeong et al. | |
| 2014/0217382 A1 | 8/2014 | Kwon et al. | |
| 2014/0367644 A1 | 12/2014 | Song et al. | |
| 2014/0374704 A1 | 12/2014 | Jang et al. | |
| 2015/0036300 A1 | 2/2015 | Park et al. | |
| 2015/0179717 A1 | 6/2015 | Kawata | |
| 2015/0179722 A1 | 6/2015 | Koo et al. | |
| 2015/0200375 A1 | 7/2015 | Kim et al. | |
| 2015/0206926 A1 | 7/2015 | Hong et al. | |
| 2016/0048252 A1 | 2/2016 | Oh | |
| 2016/0079567 A1 | 3/2016 | Cho et al. | |
| 2016/0204183 A1* | 7/2016 | Tao | H01L 25/167 257/40 |
| 2016/0210894 A1 | 7/2016 | Lee | |
| 2016/0293869 A1* | 10/2016 | Saeki | H01L 27/3276 |
| 2017/0148857 A1 | 5/2017 | Goto et al. | |
| 2017/0250237 A1 | 8/2017 | Cheng | |
| 2017/0250368 A1 | 8/2017 | Kamiya | |
| 2017/0271616 A1 | 9/2017 | Choi et al. | |
| 2017/0278899 A1* | 9/2017 | Yang | H01L 51/0097 |
| 2017/0278900 A1 | 9/2017 | Yang et al. | |
| 2017/0294620 A1 | 10/2017 | Park et al. | |
| 2018/0011576 A1 | 1/2018 | Ryu | |
| 2018/0219181 A1 | 8/2018 | Son et al. | |

FOREIGN PATENT DOCUMENTS

| | | |
|---|---|---|
| CN | 105009188 A | 10/2015 |
| EP | 2259321 A1 | 12/2010 |
| EP | 2894672 A1 | 7/2015 |
| EP | 3109742 A1 | 12/2016 |
| JP | 2003-337321 A | 11/2003 |
| KR | 10-2012-0139988 A | 12/2012 |
| KR | 10-2014-0093092 A | 7/2014 |
| KR | 10-2014-0108825 | 9/2014 |
| KR | 10-2014-0108826 | 9/2014 |
| KR | 10-2014-0108827 | 9/2014 |
| KR | 10-2014-0122597 | 10/2014 |
| KR | 10-2014-0143863 A | 12/2014 |
| KR | 10-2014-0145463 A | 12/2014 |
| KR | 10-2015-0014713 | 2/2015 |
| KR | 10-2015-0021167 A | 3/2015 |
| KR | 10-2015-0053530 A | 5/2015 |
| KR | 10-2015-0072214 A | 6/2015 |
| KR | 10-2015-0087940 A | 7/2015 |
| TW | 201340307 A | 10/2013 |
| TW | 201414377 A | 4/2014 |
| WO | WO 2014/109198 A1 | 7/2014 |

OTHER PUBLICATIONS

EPO Partial Search Report dated Jun. 28, 2017, for corresponding European Patent Application No. 17160192.5 (28 pages).
EPO Extended European Search Report dated Sep. 13, 2017, issued in European Patent Application No. 17161262.5 (7 pages).
U.S. Office Action dated Jan. 12, 2018, issued in U.S. Appl. No. 15/285,219 (8 pages).
U.S. Office Action dated Jul. 19, 2018, issued in U.S. Appl. No. 15/285,270 (23 pages).

* cited by examiner

DISPLAY APPARATUS AND METHOD OF MANUFACTURING THE SAME

CROSS-REFERENCE TO RELATED APPLICATION

This application is a continuation of U.S. patent application Ser. No. 15/417,000, filed Jan. 26, 2017, which claims priority to and the benefit of Korean Patent Application No. 10-2016-0029696, filed Mar. 11, 2016, the entire content of both of which is incorporated herein by reference.

BACKGROUND

1. Field

One or more aspects of example embodiments of the present disclosure are related to a display apparatus and a method of manufacturing the display apparatus, and more particularly, to a method of manufacturing a display apparatus that may be capable of reducing manufacturing costs and defect rate (e.g., the ratio of defective units) during manufacturing, and a display apparatus.

2. Description of the Related Art

In general, a display apparatus includes a display unit on a substrate. In such a display apparatus, at least a part of the display apparatus may be bent so as to improve visibility at one or more angles or to reduce the area of the non-display area.

However, defects may occur and/or the lifespan of the display apparatus may be reduced in a bendable display apparatus manufactured according to methods in the related art.

SUMMARY

One or more aspects of example embodiments of the present disclosure are directed toward a method of manufacturing a display apparatus that is capable of reducing manufacturing costs and defect rate (e.g., the ratio of defective units) during manufacturing, and a display apparatus.

Additional aspects will be set forth in part in the description which follows and, in part, will be apparent from the description, or may be learned by practice of the presented embodiments.

One or more example embodiments of the present disclosure provide a method of manufacturing a display apparatus, the method including: forming a plurality of display units over a mother substrate; attaching a temporary protective film to a lower surface of the mother substrate; cutting the mother substrate and the temporary protective film along a periphery of each of the plurality of display units to obtain a plurality of display panels, each display panel comprising a first area, a second area, and a bent area (e.g., bendable area) between the first area and the second area; removing the temporary protective film from the plurality of display panels; and attaching a lower protective film to a lower surface of each of the plurality of display panels to correspond to the first area in each display panel.

The attaching of the lower protective film may include attaching the lower protective film having an area greater than an area of the first area to expose an exposed part of the lower protective film to outside of the display panel. The method may further include removing the exposed part of the lower protective film. The method may further include removing the exposed part of the lower protective film by irradiating the lower protective film with a laser beam.

The method may further include bending the display panel in the bent area around a bending axis that crosses a virtual straight line connecting a center of the first area and a center of the second area.

The first area in each of the plurality of display panels may include a corresponding one of the plurality of display units.

The forming of the plurality of display units may include forming the mother substrate over a carrier substrate and forming the plurality of display units over the mother substrate. The method may further include separating the mother substrate from the carrier substrate, wherein the attaching the temporary protective film may include attaching the temporary protective film to a lower surface of the mother substrate, from which the carrier substrate is separated.

The method may further include attaching a printed circuit board and/or an electronic chip to the second area in each of the plurality of display panels, before removing the temporary protective film. A length of the second area may be equal to a length of the printed circuit board or the electronic chip along a direction crossing (e.g., perpendicular or normal to) a virtual straight line connecting a center of the first area to a center of the second area.

One or more example embodiments of the present disclosure provide a method of manufacturing a display apparatus, the method including: preparing a substrate including a bent area between a first area and a second area; attaching a temporary protective film to a lower surface of the substrate throughout the first area, the bent area, and the second area; removing the temporary protective film; and attaching a lower protective film to the lower surface of the substrate to correspond to the first area.

The attaching of the lower protective film may include attaching the lower protective film having an area greater than an area of the first area to the lower surface of the substrate to expose an exposed part of the lower protective film to outside of the substrate. The method may further include removing the exposed part of the lower protective film. The method may further include removing the exposed part of the lower protective film by irradiating the lower protective film with a laser beam.

The method may further include bending the substrate around a bending axis in the bent area.

The method may further include forming a display unit over the substrate in the first area.

The method may further include attaching a printed circuit board or an electronic chip to the second area of the substrate, before removing the temporary protective film. A length of the second area may be equal to a length of the printed circuit board or the electronic chip along a direction crossing (e.g., perpendicular or normal to) a virtual straight line connecting a center of the first area to a center of the second area.

One or more example embodiments of the present disclosure provide a display apparatus including: a substrate including a bent area between a first area and a second area, the bent area being bent around a bending axis so that a lower surface of the substrate in the first area and the lower surface of the substrate in the second area at least partially face each other; a display unit over an upper surface of the substrate in the first area; a lower protective film over the lower surface of the substrate in at least a part of the first area; and a support layer between the lower protective film in the first area and the lower surface of the substrate in the second area.

The support layer may be adhered to the lower protective film in the first area and the lower surface of the substrate in the second area.

A distance between a first lower surface of the substrate in the first area where the support layer is located and a second lower surface of the substrate in the second area where the support layer is located may be less than a maximum distance between facing portions of the substrate in a part of the substrate between the first lower surface and the second lower surface.

A part of the upper surface of the substrate between a first upper surface of the substrate where the support layer is located and a second upper surface of the substrate where the support layer is located may protrude past a first virtual plane including the second upper surface of the substrate where the support layer is located within the second area, in a direction away from the display unit. Another part of the upper surface of the substrate between the first upper surface of the substrate where the support layer is located and the second upper surface of the substrate where the support layer is located may protrude past a second virtual plane including first upper surface of the substrate where the display unit is located, in a direction toward the display unit.

A surface of the support layer directly facing the lower protective film may have an area that is different from an area of a surface of the support layer directly facing the substrate in the second area. A surface of the support layer directly facing the lower protective film may have an area that is greater than an area of a surface of the support layer directly facing the substrate in the second area.

The display apparatus may further include: an electronic device on a portion of the second upper surface of the substrate within the second area of the substrate where the support layer is located; and a reinforcing film over the second upper surface of the substrate adjacent to the electronic device. The reinforcing film may cover all (e.g., substantially all) of an exposed part of the second upper surface around the electronic device.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Figure 1:
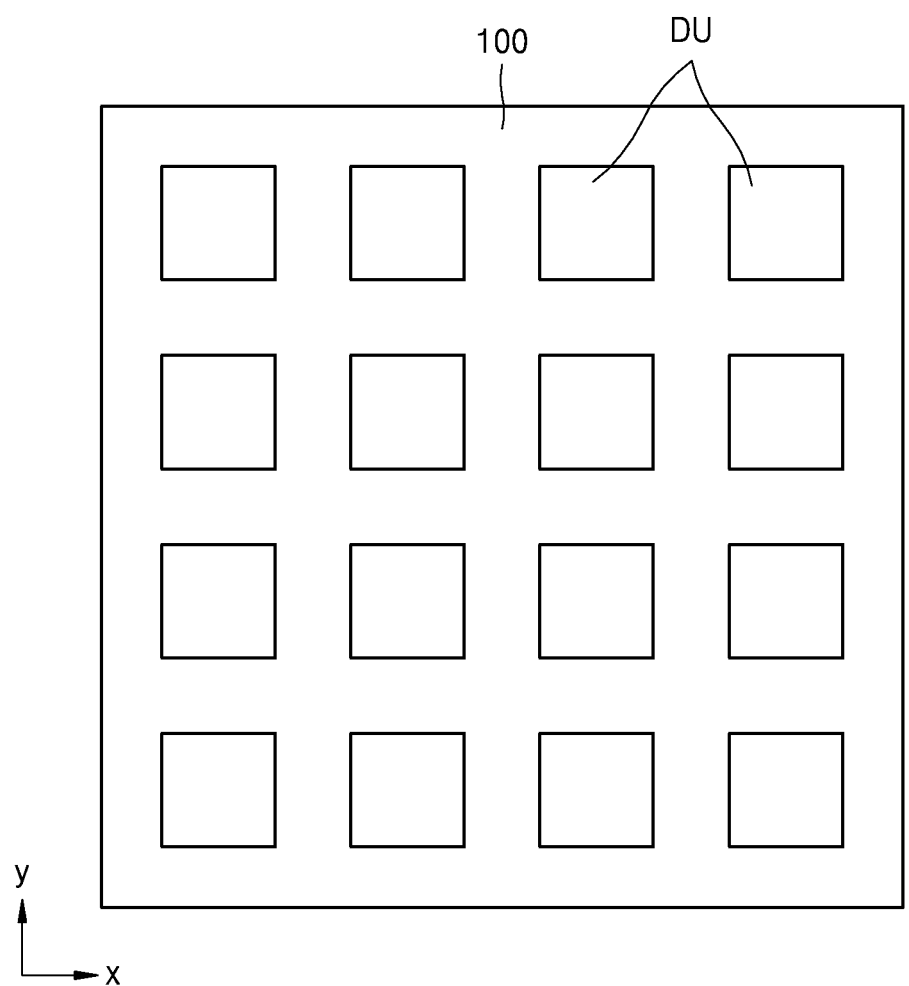
FIGS. 1, 2 to 7, and 8 are respectively a plan view, cross-sectional views, and a perspective view schematically showing processes in a method of manufacturing a display apparatus, according to an embodiment of the present disclosure.

Reference will now be made in more detail to example embodiments, examples of which are illustrated in the accompanying drawings, wherein like reference numerals refer to like elements throughout and duplicative descriptions thereof may not be provided. In this regard, the present embodiments may have different forms and should not be construed as being limited to the descriptions set forth herein. Accordingly, the embodiments are merely described below, by referring to the drawings, to explain aspects of the present description. As used herein, the term "and/or" includes any and all combinations of one or more of the associated listed items. Expressions such as "at least one of", "one of", and "selected from", when preceding a list of elements, modify the entire list of elements and do not modify the individual elements of the list.

Hereinafter, the present disclosure will be described in detail by explaining example embodiments of the present disclosure with reference to the attached drawings.

The sizes and thicknesses of components (such as of layers, films, panels, regions, etc.) in the drawings may be exaggerated for convenience of explanation. In other words, since sizes and thicknesses of components in the drawings are arbitrarily illustrated for convenience of explanation, the following example embodiments are not limited thereto.

It will be understood that when an element such as a layer, film, region, or substrate is referred to as being "on" or "over" another element, it can be directly on the other element or intervening element(s) may also be present. In contrast, when an element is referred to as being "directly on" another element, no intervening elements are present.

In the following examples, the x-axis, the y-axis, and the z-axis are not limited to three axes of the rectangular (e.g., Cartesian) coordinate system, and may be interpreted in a broader sense. For example, the x-axis, the y-axis, and the z-axis may be perpendicular to one another, or may represent different directions that are not perpendicular to one another.

FIGS. 1, 2 to 7, and 8 are respectively a plan view, cross-sectional views, and a perspective view schematically showing processes in a method of manufacturing a display apparatus, according to an embodiment of the present disclosure.

As shown in FIG. 1, a plurality of display units DU may be formed on a mother substrate 100. Other processes may be performed prior to forming the plurality of display units DU (such as a process of forming a buffer layer on an entire surface of the mother substrate 100). In some embodiments, when the plurality of display units DU are formed, electronic devices (such as thin film transistors) that are electrically connected to display devices may be formed in addition to the display devices, and may be formed on a peripheral area that is outside of the display area on which the display devices are located. In some embodiments, an encapsulation layer for protecting the display devices may be provided when the plurality of display units DU are formed. Detailed structures of the display units DU will be described later.

As described above, the mother substrate 100 (on which the plurality of display units DU are formed) may include one or more materials having flexible or bendable characteristics, for example, polymer resins (such as polyether sulfone (PES), polyacrylate, polyether imide (PEI), polyethylene naphthalate (PEN), polyethylene terephthalate (PET), polyphenylene sulfide (PPS), polyarylate (PAR), polyimide (PI), polycarbonate (PC), and/or cellulose acetate propionate (CAP)).

Figure 2:
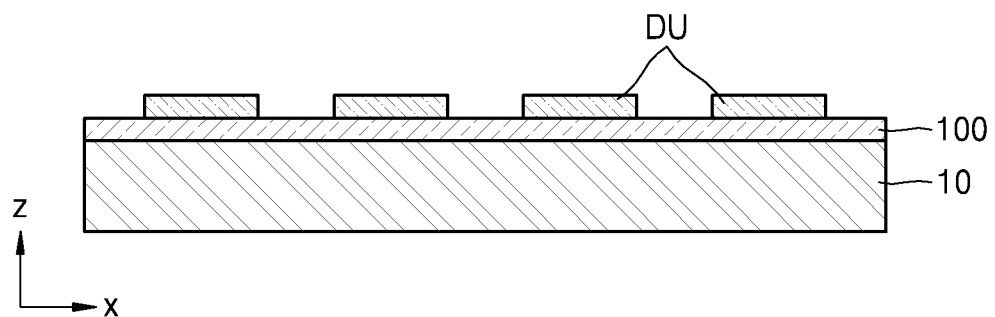

The plurality of display units DU shown in FIG. 1 are formed on the mother substrate 100, which is on a carrier substrate 10, as shown in FIG. 2. The carrier substrate 10 may include, for example, glass of a sufficient thickness. The carrier substrate 10 may have sufficient or suitable hardness so as to prevent or reduce the mother substrate 100 (which may include the flexible or bendable material) from being curved or deformed during manufacturing. For example, the mother substrate 100 may be formed on the carrier substrate 10 having sufficient or suitable hardness, and the plurality of display units DU may be formed on the mother substrate 100.

Figure 3:
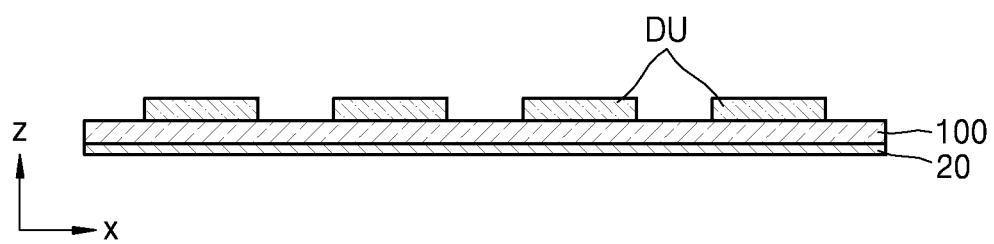

After forming the display units DU as described above, the mother substrate 100 is separated from the carrier substrate 10. As shown in FIG. 3, a temporary protective film 20 is then attached to a lower surface of the mother substrate 100 (e.g., the surface perpendicular or normal to a −z direction). The temporary protective film 20 may prevent or reduce the lower surface of the mother substrate 100 from being damaged during manufacturing. The temporary protective film 20 will be removed during manufacturing, as will be described later, and therefore an adhesive force between the temporary protective film 20 and the mother substrate 100 may not be strong. Accordingly, as will be described later, an adhesive applied between the temporary protective film 20 and the mother substrate 100 may not have a strong adhesive force.

After attaching the temporary protective film 20 to the lower surface of the mother substrate 100, the mother substrate 100 and the temporary protective film 20 are simultaneously cut (e.g., at the same time). For example, the mother substrate 100 and the temporary protective film 20 are cut along a periphery of each of the plurality of display units DU, thereby yielding a plurality of display panels. The mother substrate 100 and the temporary protective film 20 may be cut in one or more ways (e.g., the mother substrate 100 and the temporary protective film 20 may be cut using a laser beam and/or a cutting wheel).

Figure 5:
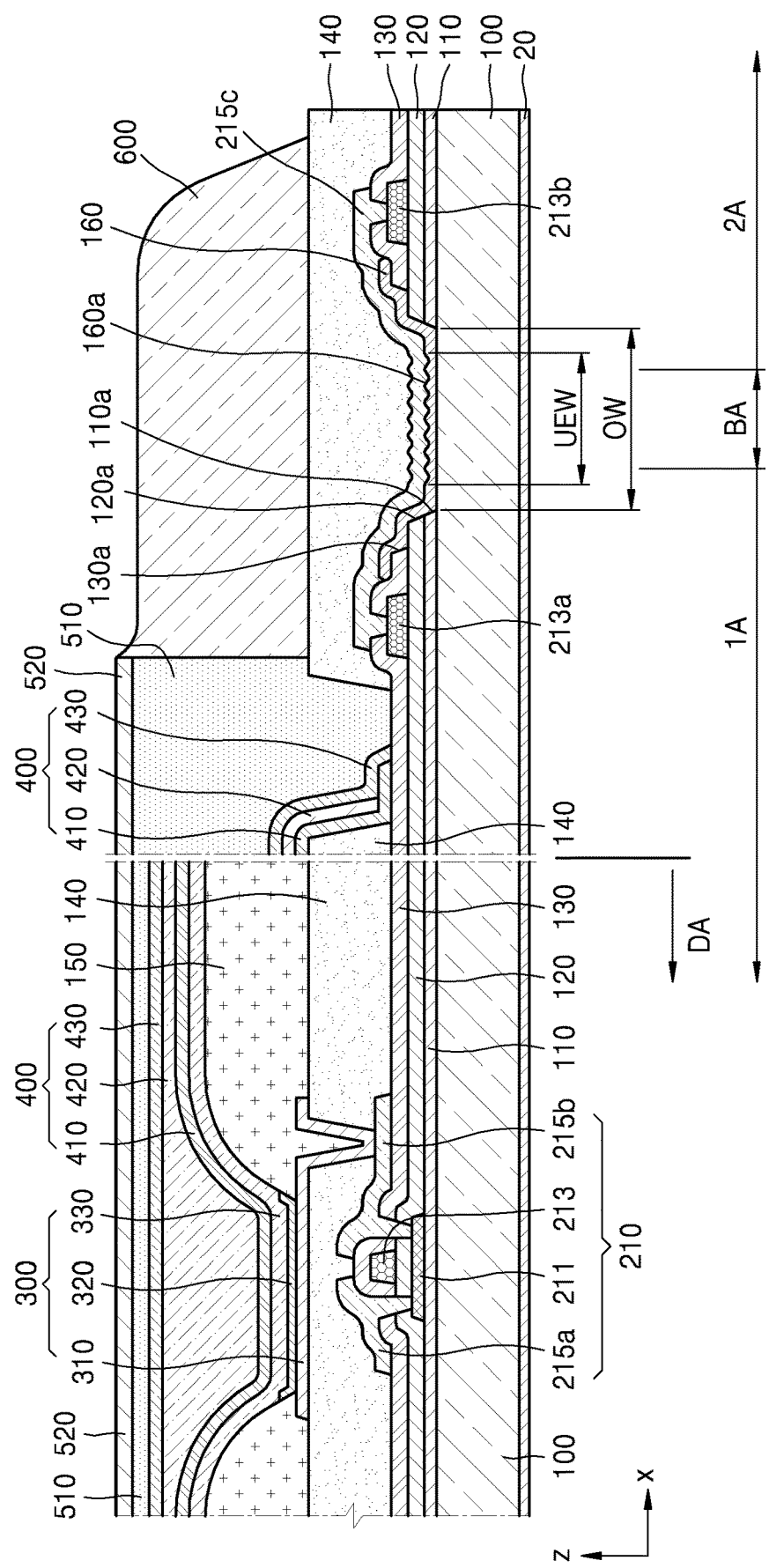

FIG. 5 is a schematic cross-sectional view of a part of one of a plurality of display panels obtained through the above processes. As shown in FIG. 5, each of the plurality of display panels includes a first area 1A, a second area 2A, and a bent area (e.g., bendable area) BA between the first area 1A and the second area 2A. Hereinafter, the substrate in each of the plurality of display panels will be denoted by the same reference numeral as the mother substrate.

The first area 1A may include a display area DA. The first area 1A may also include part of a non-display area that is on an outer portion of the display area DA. The second area 2A may also include part of the non-display area.

A display device 300 and a thin film transistor 210 (to which the display device 300 is electrically connected) may be located on the display area DA of the display panel. FIG. 5 shows that the display device 300 includes an organic light-emitting device (OLED) on the display area DA. Regarding the electric connection of the organic light-emitting device to the thin film transistor 210, the pixel electrode 310 (e.g., of the display device 300) is electrically connected to the thin film transistor 210. If necessary, a thin film transistor may be included in a peripheral area outside the display area DA on the substrate 100. The thin film transistor located in the peripheral area may be part of a circuit unit for controlling electric signals applied to the display area DA.

The thin film transistor 210 may include a semiconductor layer 211, a gate electrode 213, a source electrode 215a, and a drain electrode 215b, and the semiconductor layer 211 may include amorphous silicon, polycrystalline silicon, or an organic semiconductor material. A gate insulating layer 120 may be between the semiconductor layer 211 and the gate electrode 213 in order to ensure insulation between the semiconductor layer 211 and the gate electrode 213, and the gate insulating layer 120 may include an inorganic material (such as silicon oxide, silicon nitride, and/or silicon oxynitride). In some embodiments, an interlayer insulating layer 130 may be on the gate electrode 213, and the source electrode 215a and the drain electrode 215b may be on the interlayer insulating layer 130, the interlayer insulating layer 130 including an inorganic material (such as silicon oxide, silicon nitride, and/or silicon oxynitride). The insulating layers including the inorganic material as above may be formed by chemical vapor deposition (CVD) or atomic layer deposition (ALD). This may also be applied to one or more embodiments that will be described later and modified examples thereof.

A buffer layer 110 may be between the thin film transistor 210 having the above structure and the substrate 100, as described above. The buffer layer 110 may include an inorganic material (such as silicon oxide, silicon nitride, and/or silicon oxynitride). The buffer layer 110 may improve the flatness of (e.g., planarize) an upper surface of the substrate 100, or may prevent or reduce infiltration of impurities from the substrate 100 into the semiconductor layer 211 of the thin film transistor 210.

In some embodiments, a planarization layer 140 may be over the thin film transistor 210. For example, as shown in FIG. 5, when an organic light-emitting device is on the thin film transistor 210, the planarization layer 140 may planarize an upper portion of a protective layer covering the thin film transistor 210. The planarization layer 140 may include an organic material, e.g., acryl, benzocyclobutene (BCB), and/or hexamethyldisiloxane (HMDSO). In FIG. 5, the planarization layer 140 has a single-layered structure, but may be modified in one or more suitable embodiments. For example, the planarization layer 140 may have a multi-layered structure. In some embodiments, the planarization layer 140 may have an opening near an outer portion of the display area DA so that the region of the planarization layer 140 corresponding to the display area DA and the region of the planarization layer 140 corresponding to the second area 2A may be physically separated from each other. Thus, impurities from the outside may not reach the display area DA via the planarization layer 140.

In the display area DA, an organic light-emitting device may be on the planarization layer 140, wherein the organic light-emitting device includes a pixel electrode 310, an opposite electrode 330, and an intermediate layer 320 between the pixel electrode 310 and the opposite electrode 330 and including an emission layer. The pixel electrode 310 may contact one of the source electrode 215a and the drain electrode 215b via an opening in the planarization layer 140, as shown in FIG. 5, so as to be electrically connected to the thin film transistor 210.

A pixel defining layer 150 may be over the planarization layer 140. The pixel defining layer 150 may have openings corresponding to the areas of one or more sub-pixels, that is, openings exposing at least a center portion of the pixel electrode 310, thereby defining the pixels. Also, in the embodiment of FIG. 5, the pixel defining layer 150 increases a distance between an edge of the pixel electrode 310 and an edge of the opposite electrode 330 over the pixel electrode 310, so as to prevent or reduce generation of an arc at the edge of the pixel electrode 310. The pixel defining layer 150 may include, for example, an organic material such as polyimide and/or HMDSO.

The intermediate layer 320 of the organic light-emitting device may include low-molecular weight organic materials or polymer materials. When the intermediate layer 320 includes a low-molecular weight organic material, the intermediate layer 320 may include a hole injection layer (HIL), a hole transport layer (HTL), an emission layer (EML), an electron transport layer (ETL), and an electron injection layer (EIL) in a single or multiple-layered structure. Non-limiting examples of organic materials may include copper phthalocyanine (CuPc), N,N'-di(naphthalene-1-yl)-N,N'-di-phenyl-benzidine (NPB), and tris-8-hydroxyquinoline aluminum ($Alq_3$). The low-molecular weight organic materials may be deposited by a vacuum deposition method.

When the intermediate layer 320 includes a polymer material, the intermediate layer 320 may include an HTL and an EML. Here, the HTL may include PEDOT, and the EML may include a poly-phenylene vinylene (PPV)-based or polyfluorene-based polymer material. The intermediate layer 320 may be formed using a screen printing method, an inkjet printing method, and/or a laser induced thermal imaging (LITI) method.

However, the intermediate layer 320 is not limited to the above example, and may have one or more suitable structures. In some embodiments, the intermediate layer 320 may include a layer that is integrally formed throughout a plurality of pixel electrodes 310, or a layer that is patterned to correspond to each of the plurality of pixel electrodes 310.

The opposite electrode 330 is above the display area DA, and as shown in FIG. 5, may cover (e.g., substantially cover) the display area DA. For example, the opposite electrode 330 may be integrally formed with respect to a plurality of organic light-emitting devices, so as to correspond to the plurality of pixel electrodes 310.

Since the organic light-emitting device may be easily damaged by external moisture or oxygen, an encapsulation layer 400 may cover and protect the organic light-emitting device. The encapsulation layer 400 covers the display area DA, and then may extend outside the display area DA. The encapsulation layer 400 may include a first inorganic encapsulation layer 410, an organic encapsulation layer 420, and a second inorganic encapsulation layer 430, as shown in FIG. 5.

The first inorganic encapsulation layer 410 covers the opposite electrode 330, and may include silicon oxide, silicon nitride, and/or silicon oxynitride. If necessary, other layers (such as a capping layer) may be between the first inorganic encapsulation layer 410 and the opposite electrode 330. Since the first inorganic encapsulation layer 410 is formed according to a structure thereunder, the first inorganic encapsulation layer 410 may have an uneven upper surface, as shown in FIG. 5. The organic encapsulation layer 420 may cover the first inorganic encapsulation layer 410, and unlike the first inorganic encapsulation layer 410, the organic encapsulation layer 420 may have an even upper surface. In more detail, the organic encapsulation layer 420 may have a roughly even upper surface at a portion corresponding to the display area DA. The organic encapsulation layer 420 may include at least one material selected from polyethylene terephthalate, polyethylene naphthalate, polycarbonate, polyimide, polyethylene sulfonate, polyoxymethylene, polyarylate, and hexamethyldisiloxane. The second inorganic encapsulation layer 430 covers the organic encapsulation layer 420, and may include silicon oxide, silicon nitride, and/or silicon oxynitride. The second inorganic encapsulation layer 430 may contact the first inorganic encapsulation layer 410 at an edge thereof at an outer portion of the display area DA, in order not to expose the organic encapsulation layer 420 to the outside.

As described above, when the encapsulation layer 400 includes the first inorganic encapsulation layer 410, the organic encapsulation layer 420, and the second inorganic encapsulation layer 430, even if a crack occurs in the encapsulation layer 400 having the above multi-layered structure, the crack may be disconnected (e.g., disjoint) between the first inorganic encapsulation layer 410 and the organic encapsulation layer 420 or between the organic encapsulation layer 420 and the second inorganic encapsulation layer 430. As such, formation of a path through which external moisture or oxygen may infiltrate into the display area DA may be prevented or reduced.

After the plurality of display panels having the above structures is obtained, elements may be formed on each of the plurality of display panels. For example, a polarization plate 520 may be attached to the encapsulation layer 400 via an optically clear adhesive (OCA) 510. The polarization plate 520 may reduce reflection of external light. For example, when external light passes through the polarization plate 520, is reflected by an upper surface of the opposite electrode 330, and then passes through the polarization plate 520 again, the external light passes through the polarization plate 520 twice and a phase of the external light may be thereby changed. When the phase of reflected light is different from the phase of the external light originally entering the polarization plate 520, destructive interference occurs, and accordingly, the reflection of the external light may be reduced and visibility may be improved. The OCA 510 and the polarization plate 520 may cover an opening in the planarization layer 140 as shown in FIG. 5.

The method of manufacturing the display apparatus according to embodiments of the present disclosure may not include the process of forming the polarization plate 520, and in some embodiments, the polarization plate 520 may not be provided or may be replaced with another component. For example, the polarization plate 520 may not be provided, and instead, a black matrix and a color filter may be formed to reduce the reflection of external light in the display apparatus manufactured by the method.

Figure 6:
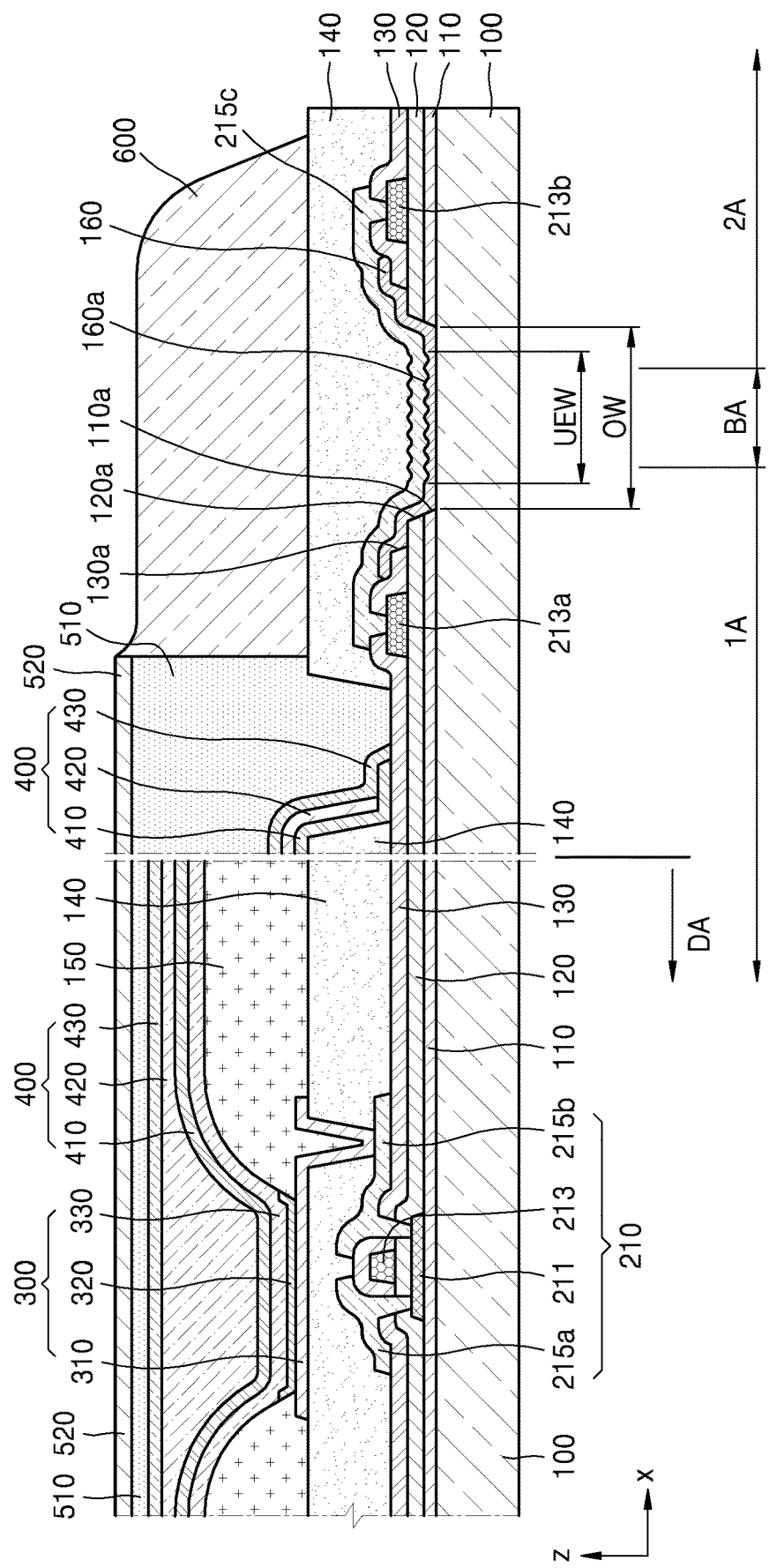

After that, as shown in FIG. 6, the temporary protective film 20 is removed from the plurality of display panels. In some embodiments, as shown in FIG. 7, a lower protective film 170 is attached to a lower surface (e.g., the surface perpendicular or normal to a −z direction) of each of the display panels so as to correspond to the first area 1A in each of the plurality of display panels.

Figure 7:
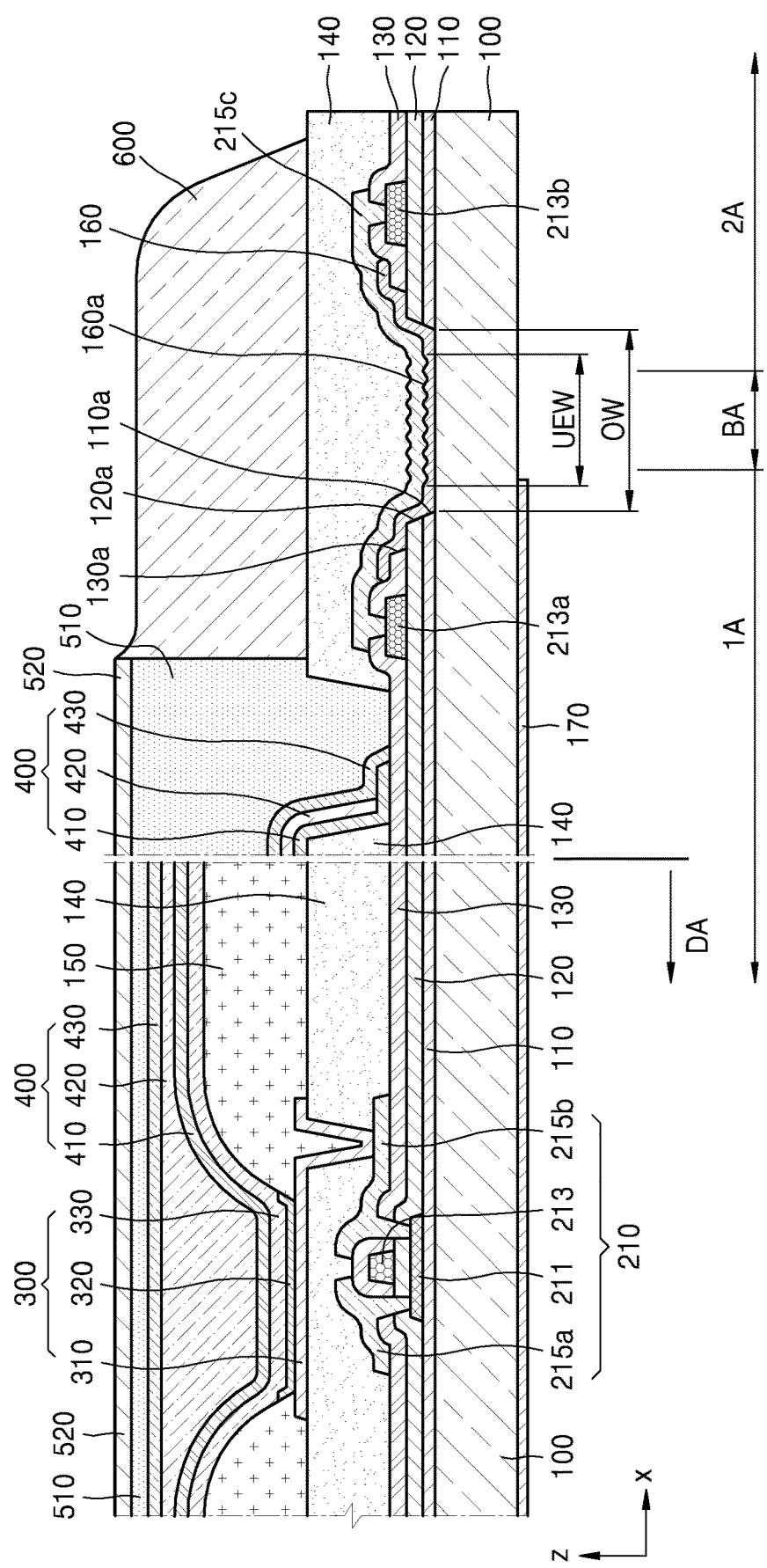

The lower protective film 170 covers (e.g., substantially covers) most of the first area 1A of the display panel, as shown in FIG. 7. In some embodiments, the lower protective film 170 does not cover the bent area BA and the second area 2A of the display panel. As shown in FIG. 7, an edge of the lower protective film 170 facing toward the second area 2A may be within the first area 1A so as not to overlap with the bent area BA, and moreover, not to contact the bent area BA. Here, even when the edge of the lower protective film 170 facing toward the second area 2A is within the first area 1A, the edge may slightly vertically overlap with a part of an organic material layer 160, which may have an uneven surface 160a, as shown in FIG. 7. This is because the lower protective film 170 covers as much of the lower surface of the display panel as possible to protect a large part of the display panel. The lower protective film 170 protects the lower surface of the display panel, for example, a lower surface of the substrate 100 (e.g., the surface perpendicular or normal to a −z direction), and to do this, the lower protective film 170 may have a sufficient or suitable level of hardness. For example, the lower protective film 170 may include polyethylene terephthalate (PET).

Since the lower protective film 170 protects the lower surface of the substrate 100, the lower protective film 170 does not need to be easily removed during handling. Therefore, an adhesive force between the lower protective film 170 and the substrate 100 may be maintained at a sufficiently or suitably strong degree. To do this, the adhesive between the lower protective film 170 and the substrate 100 needs to have a sufficiently strong adhesive force. As described above, the adhesive force between the temporary protective film 20 and the substrate 100 may not be strong. Accordingly, the adhesive force between the lower protective film 170 and the substrate 100 may be greater than that between the temporary protective film 20 and the mother substrate 100.

When a film is attached to a substrate by an adhesive, an ultra-violet (UV) curable adhesive may be used, and the UV curable adhesive may be irradiated with a suitable amount of UV light in order to adjust the adhesive force of the adhesive. Here, the adhesive force of the adhesive may be controlled by adjusting the time period of UV light exposure or the intensity of the UV light. Therefore, the time period of UV light exposure of the adhesive between the temporary protective film 20 and the mother substrate 100 may be longer than that of the adhesive between the lower protective film 170 and the substrate 100, and thus, the adhesive force between the lower protective film 170 and the substrate 100 may be greater than that between the temporary protective film 20 and the mother substrate 100. In another embodiment, the intensity of the UV light irradiated onto the adhesive between the temporary protective film 20 and the mother substrate 100 may be greater than the intensity of the UV light irradiated onto the adhesive between the lower protective film 170 and the substrate 100, and thus, the adhesive force between the lower protective film 170 and the substrate 100 may be greater than that between the temporary protective film 20 and the mother substrate 100.

When the coverage ratio of the adhesive between the lower protective film 170 and the substrate 100 on the substrate 100 is greater than the coverage ratio of the adhesive between the temporary protective film 20 and the mother substrate 100 on the mother substrate 100, the total adhesive force between the lower protective film 170 and the substrate 100 may be greater than the total adhesive force between the temporary protective film 20 and the mother substrate 100. In this case, it is assumed that the adhesive between the temporary protective film 20 and the mother substrate 100 is not applied to the entire area of the mother substrate 100 or the temporary protective film 20 (e.g., the coverage ratio is less than 1).

Figure 8:
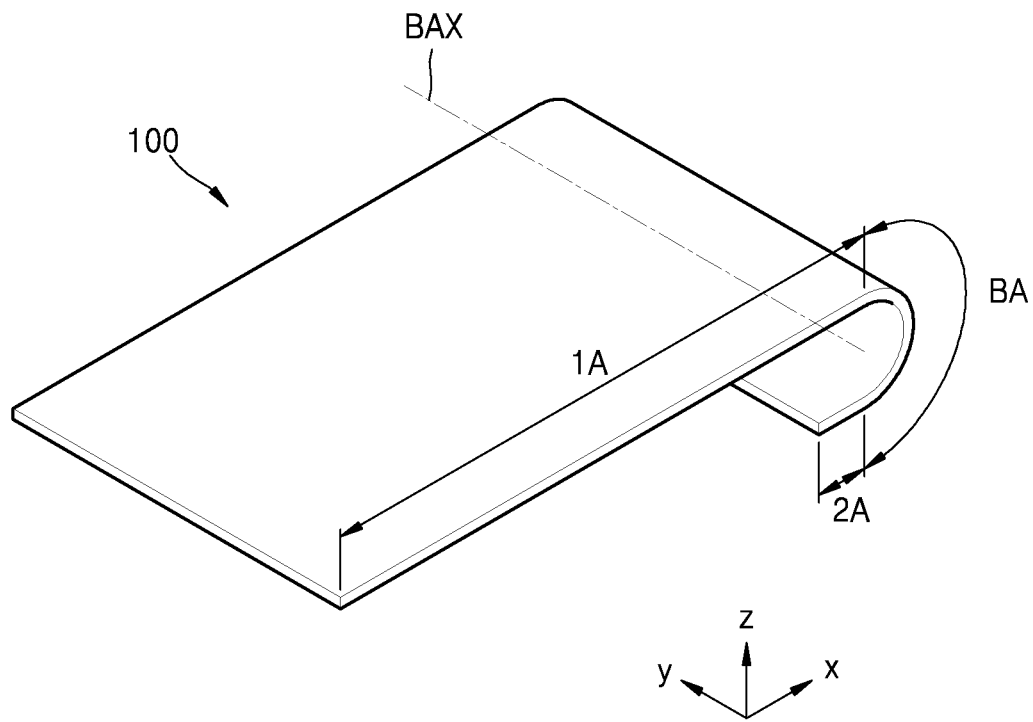

As described above, after the lower protective film 170 is attached to the substrate 100, the display panel may be bent as shown in FIG. 8. FIG. 8 only shows the substrate 100 for convenience of description. The substrate 100 is bent at the bent area BA, and in particular, the substrate 100 is bent around a bending axis BAX that crosses a virtual line IL (see FIG. 9) that connects a center C1 of the first area 1A to a center C2 of the second area 2A.

Here, since the lower protective film 170 corresponding to the first area 1A is not in the bent area BA as described above, the lower protective film 170 may not cause defects when the display panel is bent. Since the lower protective film 170 protects the lower surface of the substrate 100, the lower protective film 170 may have its own hardness (e.g., may be rigid). Accordingly, if the lower protective film 170 is also on the bent area BA, the lower protective film 170 may be separated from the substrate 100 when the substrate 100 is bent because the lower protective film 170 has low flexibility. Alternatively, if the lower protective film 170 is on the bent area BA, defects such as wrinkles may occur on the lower protective film 170 in the bent area BA when the substrate 100 is bent. However, according to the method of manufacturing the display apparatus in embodiments of the present disclosure, since the lower protective film 170 is not within the bent area BA, such defects may be prevented or reduced when bending the display panel after attaching the lower protective film 170 to the display panel.

The buffer layer 110, the gate insulating layer 120, and the interlayer insulating layer 130 including the inorganic material may be collectively referred to as a first inorganic insulating layer. The first inorganic insulating layer may have a first opening corresponding to the bent area BA, as shown in FIGS. 5 to 7. For example, the buffer layer 110, the gate insulating layer 120, and the interlayer insulating layer 130 may respectively have openings 110a, 120a, and 130a corresponding to the bent area BA. The phrase "the first opening corresponds to the bent area BA" may denote that the first opening overlaps with the bent area BA. In some embodiments, the area of the first opening may be greater than that of the bent area BA. For example, in FIGS. 5 to 7, a width OW of the first opening is greater than a width of the bent area BA. Here, the area of the first opening may be defined as the smallest area among the openings 110a, 120a, and 130a of the buffer layer 110, the gate insulating layer 120 and the interlayer insulating layer 130. In some embodiments, in FIGS. 5 to 7, the area of the first opening may be defined by an area of the opening 110a in the buffer layer 110.

In FIGS. 5 to 7, an inner side surface of the opening 110a of the buffer layer 110 and an inner side surface of the opening 120a in the gate insulating layer 120 correspond to each other, but embodiments of the present disclosure are not limited thereto. For example, an area of the opening 120a of the gate insulating layer 120 may be greater than an area of the opening 110a in the buffer layer 110. In this case, the area of the first opening may be defined as the smallest area among the openings 110a, 120a, and 130a of the buffer layer 110, the gate insulating layer 120, and the interlayer insulating layer 130.

When the plurality of display units DU are formed as described above, the organic material layer 160 may be formed to at least partially fill the first opening in the first inorganic insulating layer. In FIGS. 5 to 7, the organic material layer 160 completely fills the first opening, and the display unit DU includes a first conductive layer 215c that extends from the first area 1A toward the second area 2A through the bent area BA, located on the organic material layer 160. The first conductive layer 215c may be on an inorganic insulating layer (such as the interlayer insulating layer 130) where there is no organic material layer 160. The first conductive layer 215c may be formed simultaneously with (e.g., at the same time as) the source electrode 215a or the drain electrode 215b using the same material as the source electrode 215a or the drain electrode 215b.

As described above, after the lower protective film 170 is attached to the lower surface of the substrate 100, as shown in FIG. 7, the display panel may be bent at the bent area BA, as shown in FIG. 8. Here, tensile stress may be applied to the first conductive layer 215c while the substrate 100 is bent at the bent area BA, but the method of manufacturing the display apparatus according to the embodiment of the present disclosure may prevent or reduce the occurrence of defects in the first conductive layer 215c during the bending process.

If the first inorganic insulating layer including the buffer layer 110, the gate insulating layer 120, and/or the interlayer insulating layer 130 does not include an opening at the bent area BA, but is formed continuously from the first area 1A to the second area 2A, and if the first conductive layer 215c is on the first inorganic insulating layer, a large tensile stress may be applied to the first conductive layer 215c when the substrate 100 is bent. For example, if the first inorganic insulating layer has a higher hardness than the organic material layer, cracks are more likely to occur in the first inorganic insulating layer at the bent area BA. If a crack occurs in the first inorganic insulating layer, the first conductive layer 215c on the first inorganic insulating layer may also have a crack, and thus, there is a high possibility of generating a defect such as a disconnection in the first conductive layer 215c.

However, in the method of manufacturing the display apparatus according to embodiments of the present disclosure, the first inorganic insulating layer has the first opening at the bent area BA (as described above), and the part of the first conductive layer 215c corresponding to the bent area BA is on the organic material layer 160, which fills at least a part of the first inorganic insulating layer. Since the first inorganic insulating layer has the first opening at the bent area BA, the possibility of generating a crack in the first inorganic insulating layer is low, and the possibility of generating a crack in the organic material layer 160 is also low, due to the organic material content. Therefore, the occurrence of the crack in the part of the first conductive layer 215c corresponding to the bent area BA and located on the organic material layer 160 may be prevented or reduced. Since the organic material layer 160 has a hardness that is lower than that of the inorganic material layer, the tensile stress generated due to the bending of the substrate 100 may be absorbed by the organic material layer 160 so that concentration of the tensile stress onto the first conductive layer 215c may be effectively reduced.

In some embodiments, when the display unit DU is formed, second conductive layers 213a and 213b, in addition to the first conductive layer 215c, may be formed. The second conductive layers 213a and 213b may be on the first area 1A or the second area 2A at a different layer level from that of the first conductive layer 215c, and may be electrically connected to the first conductive layer 215c. In FIGS. 5 to 7, the second conductive layers 213a and 213b are located at the same layer level as the gate electrode 213 of the thin film transistor 210, for example, on the gate insulating layer 120, and may include the same material as the gate electrode 213. In some embodiments, the first conductive layer 215c contacts the second conductive layers 213a and 213b via contact holes formed in the interlayer insulating layer 130. In some embodiments, the second conductive layer 213a is located above the first area 1A, and the second conductive layer 213b is located above the second area 2A.

The second conductive layer 213a located over the first area 1A may be electrically connected to the thin film transistor 210 in the display area DA, and accordingly, the first conductive layer 215c may be electrically connected to the thin film transistor 210 in the display area DA via the second conductive layer 213a. The second conductive layer 213b located in the second area 2A may be electrically connected to the thin film transistor 210 in the display area DA via the first conductive layer 215c, as well. As described above, the second conductive layers 213a and 213b on the outer portion of the display area DA may be electrically connected to components in the display area DA, and/or may extend toward the display area DA and be at least partially in the display area DA.

As described above, after the lower protective film 170 is attached to the lower surface of the substrate 100, as shown in FIG. 7, the display panel is bent at the bent area BA, as shown in FIG. 8. Here, tensile stress may be applied to the elements within the bent area BA when the substrate 100 is bent at the bent area BA.

Therefore, the first conductive layer 215c that extends across the bent area BA may include a material having a high elongation rate, and thus, the occurrence of cracks in the first conductive layer 215c and/or a defect such as a disconnection in the first conductive layer 215c may be prevented or reduced. In some embodiments, the second conductive layers 213a and 213b may include a material having a lower elongation rate than that of the first conductive layer 215c, and/or electrical/physical characteristics different from those of the first conductive layer 215c on the first area 1A or the second area 2A, and thus, the efficiency of transferring electrical signals in the display apparatus may be improved and/or a defect rate (e.g., the ratio of defective units) during manufacturing may be reduced. For example, the second conductive layers 213a and 213b may include molybdenum, and the first conductive layer 215c may include aluminum. In some embodiments, the first conductive layer 215c and the second conductive layers 213a and 213b may include multi-layered structures.

In some embodiments unlike the examples shown in FIGS. 5 to 7, an upper surface of the second conductive layer 213b located in the second area 2A may not be covered by the planarization layer 140, but may be exposed to the outside so as to be electrically connected to one or more electronic devices or printed circuit boards.

In some embodiments, as shown in FIGS. 5 to 7, the organic material layer 160 may have an uneven surface 160a in at least a part of an upper surface thereof (e.g., the surface perpendicular or normal to +z direction). When the organic material layer 160 has the uneven surface 160a, the first conductive layer 215c located on the organic material layer 160 may have an upper surface and/or a lower surface having a shape corresponding to the uneven surface 160a of the organic material layer 160.

As described above, since tensile stress may be applied to the first conductive layer 215c when the substrate 100 is bent at the bent area BA during manufacturing of the display apparatus, when the upper surface and/or the lower surface of the first conductive layer 215c has a shape corresponding to the uneven surface 160a of the organic material layer 160, the amount of tensile stress applied to the first conductive layer 215c may be reduced. For example, the tensile stress that may be generated during the bending process may be reduced through deformation of the organic material layer 160 having a relatively low strength, and the first conductive layer 215c having an uneven shape before the bending process may be transformed to correspond to the shape of the organic material layer 160, which is deformed due to the bending process, and thus, the occurrence of defects (such as disconnection in the first conductive layer 215c) may be prevented or reduced.

The uneven surface 160a may be formed at least partially in the upper surface of the organic material layer 160 (e.g., the surface perpendicular or normal to the +z direction), and a surface area of the upper surface of the organic material layer 160 and a surface area of the upper and lower surfaces of the first conductive layer 215c in the first opening may be increased. A large surface area on the upper surface of the organic material layer 160 and the upper and lower surfaces of the first conductive layer 215c may be associated with a large deformation margin in order to reduce the tensile stress caused upon bending of the substrate 100.

When the first conductive layer 215c is located on the organic material layer 160, the lower surface of the first conductive layer 215c has a shape corresponding to the uneven surface 160a of the organic material layer 160. However, in some embodiments the upper surface of the first conductive layer 215c may have an uneven surface that is independent from the shape of the uneven surface 160a of the organic material layer 160.

The uneven surface 160a in the upper surface of the organic material layer 160 (e.g., the surface perpendicular or normal to the +z direction) may be formed in one or more suitable ways. For example, a photoresist material may be used to form the organic material layer 160, and the amount of photo exposure may be varied across the organic material layer 160 (the upper surface of which is flat) using a slit mask or a half-tone mask, such that a certain portion(s) may be etched (removed) more than other portions. In some embodiments, the depressed portion in the upper surface of the organic material layer 160 may be etched more than other portions. However, the method of manufacturing the display apparatus according to embodiments of the present disclosure is not limited to the above example. For example, after forming the organic material layer 160 having a flat upper surface, certain portions may be removed by a dry etching method, and other suitable methods may be used.

In order for the organic material layer 160 to have the uneven surface 160a on the upper surface thereof (e.g., the surface perpendicular or normal to the +z direction), the organic material layer 160 may include a plurality of grooves in the upper surface thereof (e.g., the surface perpendicular or normal to the +z direction), wherein the plurality of grooves extend in a first direction (e.g., along the +y direction). Here, the shape of the upper surface of the first conductive layer 215c on the organic material layer 160 corresponds to the shape of the upper surface of the organic material layer 160.

The organic material layer 160 may have the uneven surface 160a only within the first opening of the first inorganic insulating layer. In FIGS. 5 to 7, a width UEW of the uneven surface 160a of the organic material layer 160 is less than a width OW of the first opening of the first inorganic insulating layer. When the organic material layer 160 has the uneven surface 160a within as well as around the first opening in the first inorganic insulating layer, the uneven surface 160a is near the internal surface of the opening 110a in the buffer layer 110, the internal surface of the opening 120a in the gate insulating layer 120, and/or the internal surface of the opening 130a in the interlayer insulating layer 130. The organic material layer 160 has a smaller thickness on the depressed portion than on the protruding portions of the uneven surface 160a (e.g., the uneven surface 160a has thicker protruding portions and thinner depressed portions), and thus, if depressed portions are around the internal surface of the opening 110a in the buffer layer 110, the internal surface of the opening 120a in the gate insulating layer 120, and/or the internal surface of the opening 130a in the interlayer insulating layer 130, the organic material layer 160 may be disconnected. Therefore, when the organic material layer 160 only has the uneven surface 160a within the first opening of the first inorganic insulating layer, the disconnection of the organic material layer 160 around the internal surface of the opening 110a in the buffer layer 110, the internal surface of the opening 120a of the gate insulating layer 120, and/or the internal surface of the opening 130a in the interlayer insulating layer 130 may be prevented or reduced.

As described above, in order not to generate the disconnection in the first conductive layer 215c at the bent area BA, the organic material layer 160 may have the uneven surface 160a corresponding to the bent area BA. Therefore, the area of the uneven surface 160a of the organic material layer 160 may be greater than that of the bent area BA and less than that of the first opening. For example, as shown in FIGS. 5 to 7, the width UEW of the uneven surface 160a of the organic material layer 160 is greater than the width of the bent area BA and less than the width OW of the first opening.

When one of the buffer layer 110, the gate insulating layer 120, and the interlayer insulating layer 130 includes an organic insulating material, the organic material layer 160 may be formed simultaneously or concurrently (e.g., at the same time) when the layer including the organic insulating material is formed, and moreover, the layer including the organic insulating material and the organic material layer 160 may be integrally formed with each other. Non-limiting examples of the organic insulating material may include polyethylene terephthalate, polyethylene naphthalate, polycarbonate, polyimide, polyethylene sulfonate, polyoxymethylene, polyarylate, and hexamethyldisiloxane.

After obtaining the plurality of display panels as shown in FIG. 5, a stress neutralization layer (SNL) 600 may be formed on an outer portion of the display area DA before removing the temporary protective film 20 from each of the plurality of display panels, as shown in FIG. 6. For example, the SNL 600 may be located over the first conductive layer 215c to at least correspond to the bent area BA.

When a stack structure is bent, there is a stress neutral plane in the stack structure. If there is no SNL 600, when the substrate 100 is bent, excessive tensile stress may be applied to the first conductive layer 215c in the bent area BA, because the location of the first conductive layer 215c may not correspond to a stress neutral plane. However, by forming the SNL 600 and adjusting a thickness and a modulus of the SNL 600, a location of the stress neutral plane in the structure including the substrate 100, the first conductive layer 215c, and the SNL 600 may be adjusted. Therefore, the stress neutral plane may be adjusted to be located around the first conductive layer 215c via the SNL 600, and thus, the tensile stress applied to the first conductive layer 215c may be reduced.

The SNL 600 may extend to an end of the substrate 100 in the display apparatus, unlike the example of FIG. 2. For example, in the second area 2A, the first conductive layer 215c, the second conductive layer 213b, and/or other conductive layers electrically connected to the first and second conductive layers may not be covered by the interlayer insulating layer 130 or the planarization layer 140, but may be electrically connected to one or more electronic devices or printed circuit boards. Accordingly, the first conductive layer 215c, the second conductive layer 213b, and/or the other conductive layers electrically connected to the first and second conductive layers may have portions that are electrically connected to the one or more electronic devices or the printed circuit boards. Here, the electrically connected portions need to be protected against external impurities such as moisture, and thus, the SNL 600 may also cover the electrically connected portions as a protective layer. To do this, the SNL 600 may extend to, for example, the end of the substrate 100 of the display apparatus.

In some embodiments, in FIGS. 5 to 7, an upper surface of the SNL 600 in a direction toward the display area DA (e.g., along the −x direction) coincides with an upper surface of the polarization plate 520 (e.g., the surface perpendicular or normal to the +z direction), but embodiments of the present disclosure are not limited thereto. For example, an end of the SNL 600 in the direction toward the display area DA (e.g., along the −x direction) may partially cover an upper surface at the edge of the polarization plate 520. Otherwise, the end of the SNL 600 in the direction toward the display area DA (e.g., along the −x direction) may not contact the polarization plate 520 and/or the OCA 510.

Figure 9:
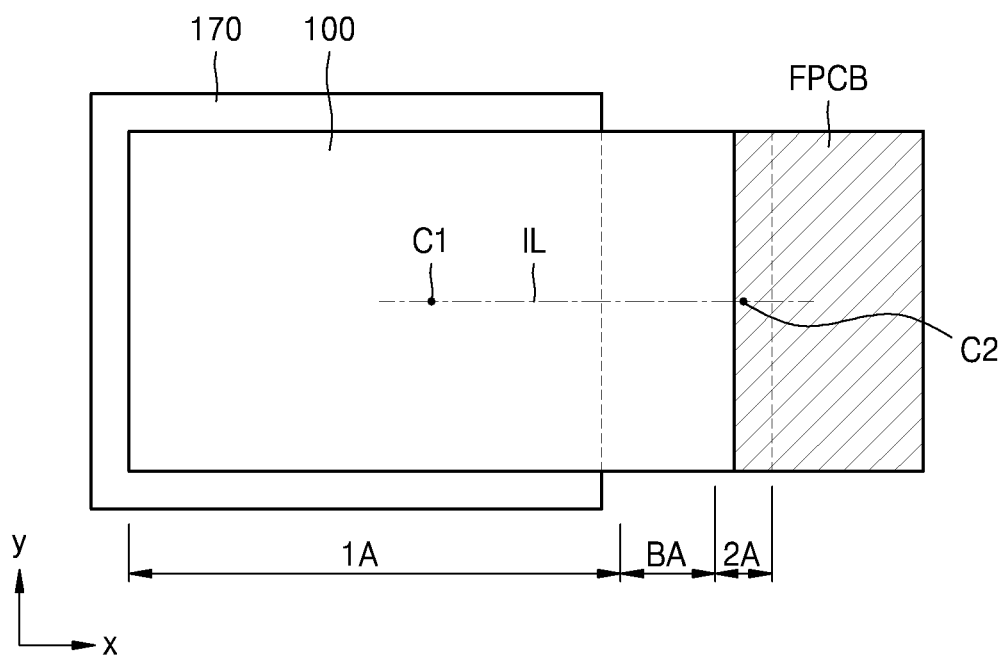
FIGS. 9 and 10 are schematic plan views of a method of manufacturing a display apparatus, according to an embodiment of the present disclosure.
Figure 10:
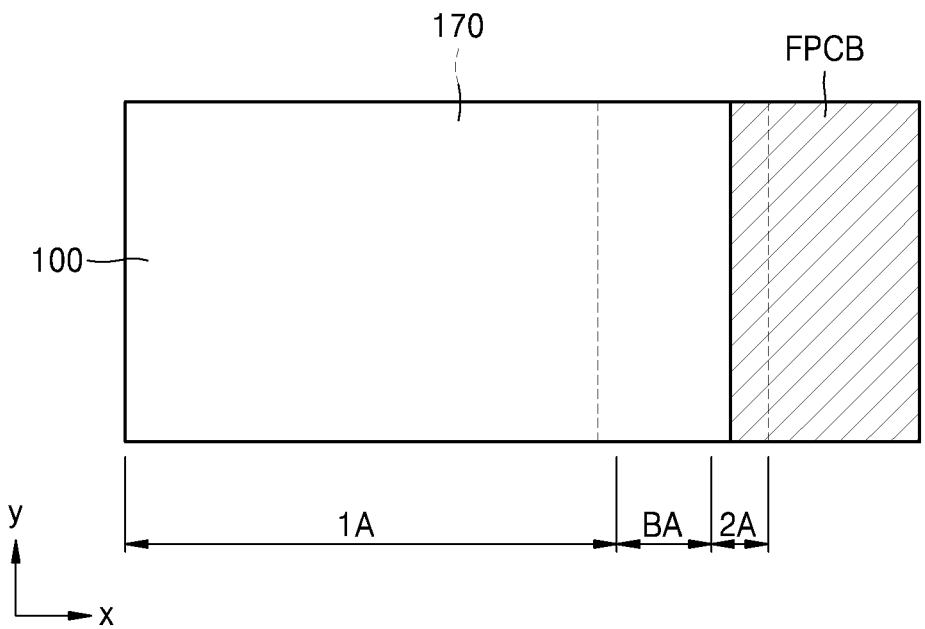

The lower protective film 170 may be attached to correspond to the first area 1A (as shown in FIG. 7) in one or more suitable ways. For example, as shown in FIG. 9, which is a schematic plan view of a process in manufacturing a display apparatus according to an embodiment of the present disclosure, the lower protective film 170 may be attached to the lower surface of the substrate 100 (e.g., the surface perpendicular or normal to the −z direction), and in particular, the lower protective film 170 may be applied to a lower surface of each of the display panels so that the lower protective film 170 having a greater area than that of the first area 1A may be partially exposed to outside of the display panel (e.g., may partially extend past the edge of the display panel). In some embodiments, as shown in FIG. 10, an exposed part of the lower protective film 170 out of the display panel (e.g., past the substrate 100), may be removed. Here, the exposed part of the lower protective film 170 out of the display panel (e.g., past the substrate 100) may be removed by irradiating the lower protective film 170 located around the edge of the substrate 100 with a laser beam.

When the lower protective film 170 is attached to the lower surface of the substrate 100, the lower protective film 170 having a width that exactly corresponds to the width of the substrate 100 (e.g., along the +y direction) may be prepared and attached to the lower surface of the substrate 100 so as not to be exposed to outside of the substrate 100. However, in this case, the lower protective film 170 and the substrate 100 have to (e.g., should) be exactly aligned (e.g., substantially aligned) with each other. In the method of manufacturing the display apparatus according to embodiments of the present disclosure, the lower protective film 170 and the substrate 100 are aligned such that the lower protective film 170 does not overlap with the bent area BA, the lower protective film 170 is attached to the lower surface of the substrate 100, and after that, only the exposed part of the lower protective film 170 exposed outside of the substrate 100 is removed. Therefore, there is no need to exactly align (e.g., substantially align) the lower protective film 170 with respect to the substrate 100, and thus, the defect rate during manufacturing may be greatly reduced and the time period taken to manufacture the display apparatus may be effectively reduced.

Figure 4:
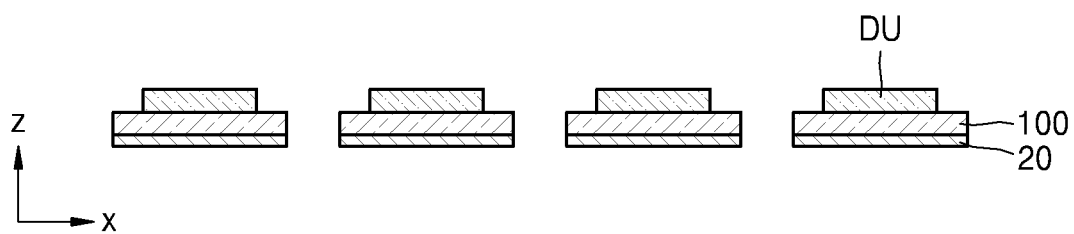

In some embodiments, as shown in FIG. 9, a printed circuit board FPCB may be attached to the display panel. The printed circuit board FPCB may be attached after the plurality of display panels is obtained by cutting the mother substrate 100 and the temporary protective film 20 (as shown in FIG. 4), and before removing the temporary protective film 20. For example, the polarization plate 520 may be attached to the encapsulation layer 400 via the OCA 510, and then the printed circuit board FPCB may be attached to the display panel before applying the SNL 600. The printed circuit board FPCB may be attached to the second area 2A of the display panel, and in this case, may be electrically connected to the second conductive layer 213b.

Here, as shown in FIGS. 9 and 10, a length of the second area 2A in a direction crossing (e.g., perpendicular or normal to) a virtual straight line IL connecting a center C1 of the first area 1A and a center C2 of the second area 2A (e.g., along the +y direction) of the display panel may be equal to a length of the printed circuit board FPCB in a direction crossing (e.g., perpendicular or normal to) the virtual straight line IL (e.g., along the +y direction).

As described above, the lower protective film 170 is attached after removing the temporary protective film 20, and the lower protective film 170 is not over or in the second area 2A, to which the printed circuit board FPCB is attached. When the printed circuit board FPCB is attached to the second area 2A after removal of the temporary protective film 20, the printed circuit board FPCB may not be attached (e.g., consistently attachable) to an exact location of the display panel due to the flexibility of the display panel. Therefore, the printed circuit board FPCB may be attached to the second area 2A of the display panel before removing the temporary protective film 20, and thus, the printed circuit board FPCB may be attached to the second area 2A of the display panel while the display panel is supported by the temporary protective film 20 to some degree.

Here, when the length of the second area 2A in the direction crossing the virtual straight line IL (e.g., along the +y direction) of the display panel is equal to the length of the printed circuit board FPCB in the direction crossing the virtual straight line IL (e.g., along the +y direction), deformation of the display panel after removal of the temporary protective film 20 may be prevented or reduced. When the length of the printed circuit board FPCB in the direction (e.g., along the +y direction) crossing the virtual straight line IL is less than the length of the second area 2A in the direction crossing the virtual straight line IL of the display panel (e.g., along the +y direction), only a part of the edge of the second area 2A extending in the direction crossing the virtual straight line IL (e.g., along the +y direction) contacts the printed circuit board FPCB. In this case, since the entire edge of the second area 2A does not contact the printed circuit board FPCB, the second area 2A may not be evenly supported by the printed circuit board FPCB, and accordingly, the substrate 100 may be deformed at the second area 2A. However, when the length of the second area 2A in the direction crossing the virtual straight line IL (e.g., along the +y direction) of the display panel is equal to the length of the printed circuit board FPCB in the direction crossing the virtual straight line IL (e.g., along the +y direction), the entire edge of the second area 2A contacts the printed circuit board FPCB, and the second area 2A is evenly supported by the printed circuit board FPCB. Accordingly, the possibility of deformation of the substrate 100 at the second area 2A may be greatly reduced.

Figure 11:
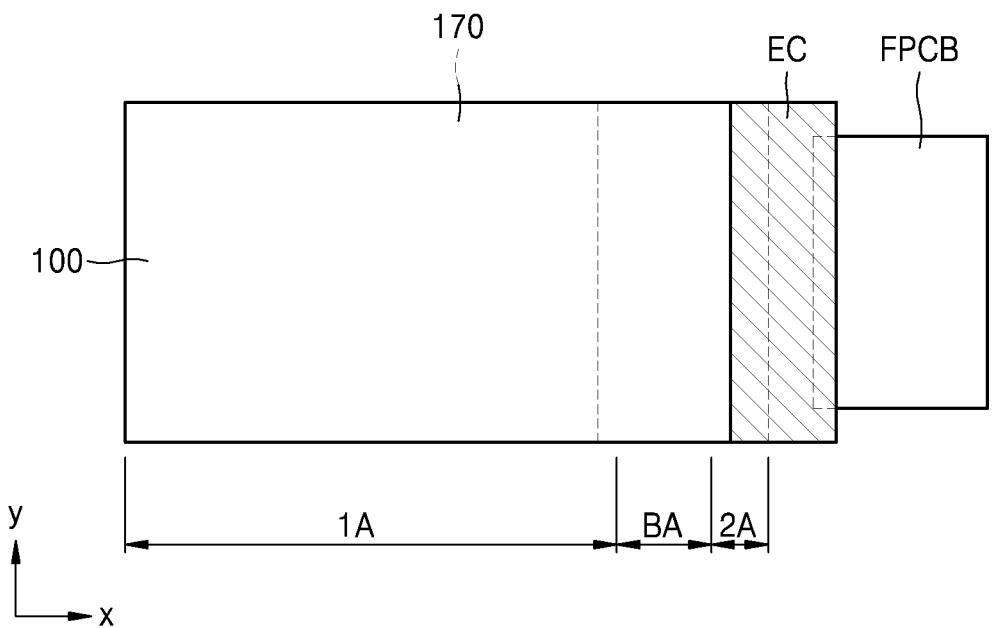
FIG. 11 is a schematic plan view of a process in a method of manufacturing a display apparatus, according to an embodiment of the present disclosure.

When the printed circuit board FPCB does not directly contact the substrate 100, but the electronic chip EC contacts the substrate 100 and the printed circuit board FPCB is electrically connected to the electronic chip EC (as shown in FIG. 11), the length of the second area 2A in the direction crossing the virtual straight line IL (e.g., along the +y direction) of the display panel may be equal to the length of the electronic chip EC in the direction crossing the virtual straight line IL (e.g., along the +y direction).

Figure 12:
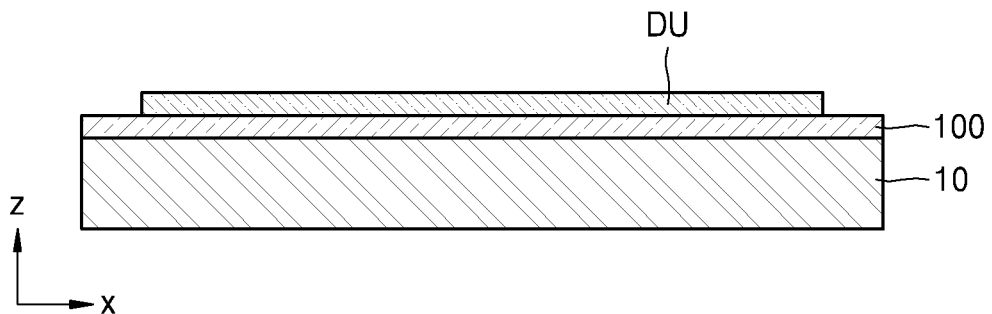
FIGS. 12 and 13 are schematic cross-sectional views of processes in a method of manufacturing a display apparatus, according to an embodiment of the present disclosure.
Figure 13:
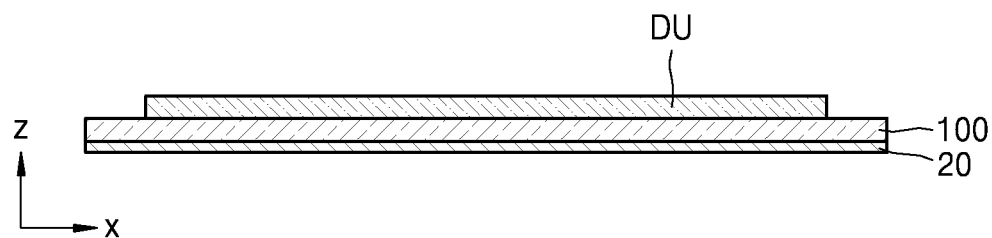

It has been described that the plurality of display units DU are formed on the mother substrate 100, and that the mother substrate 100 and the temporary protective film 20 are simultaneously cut (e.g., at the same time) to obtain the plurality of display panels, but embodiments of the present disclosure are not limited thereto. For example, as shown in FIG. 12, which is a schematic cross-sectional view of a process of manufacturing a display apparatus according to an embodiment of the present disclosure, the substrate 100 including a material having flexible or bendable characteristics may be formed on the carrier substrate 10, and then, one display unit DU may be formed on the first area 1A (e.g., as in FIG. 5) of the substrate 100. In some embodiments, as shown in FIG. 13, the substrate 100 is separated from the carrier substrate 10, and then the temporary protective film 20 may be attached to a lower surface of the substrate 100 (e.g., the surface perpendicular or normal to the −z direction).

In this case, the substrate 100 may initially include the first area 1A, the second area 2A, and the bent area BA between the first area 1A and the second area 2A, and the temporary protective film 20 may be attached to the lower surface of the substrate 100 throughout the first area 1A, the bent area BA, and the second area 2A (e.g., as in FIG. 5). FIG. 5 shows a state in which the temporary protective film 20 is attached as described above.

After that, the above descriptions with reference to FIGS. 5 to 8 may be applied to the manufacturing processes. For example, as shown in FIG. 5, the polarization plate 520 may be attached, the printed circuit board FPCB or the electronic chip EC may be electrically connected to the second conductive layer 213*b*, and the SNL 600 may be formed. In some embodiments, as shown in FIG. 6, the temporary protective film 20 may be removed, and then the lower protective film 170 may be attached to the lower surface of the substrate 100 to correspond to the first area 1A as shown in FIG. 7. In some embodiments, as shown in FIG. 8, the substrate 100 may be bent around the bending axis BAX of the bent area BA to manufacture the display apparatus.

In some embodiments, as described above with reference to FIGS. 9 and 10, the lower protective film 170 may have an area greater than that of the first area 1A so that the lower protective film 170 is partially exposed to outside the substrate 100, and the lower protective film 170 may be irradiated with a laser beam in order to remove the exposed part of the lower protective film 170. In some embodiments, as shown in FIGS. 10 and 11, the length of the second area 2A in the direction crossing the virtual straight line IL that connects the center C1 of the first area 1A and the center C2 of the second area 2A of the display panel (e.g., along the y direction) may be equal to the length of the printed circuit board FPCB or the electronic chip EC in the direction crossing the virtual straight line IL (e.g., along the y direction).

Methods of manufacturing the display apparatus are described above, but embodiments of the present disclosure are not limited thereto, and the display apparatus manufactured by the method is also included in the scope of the present disclosure.

Figure 14:
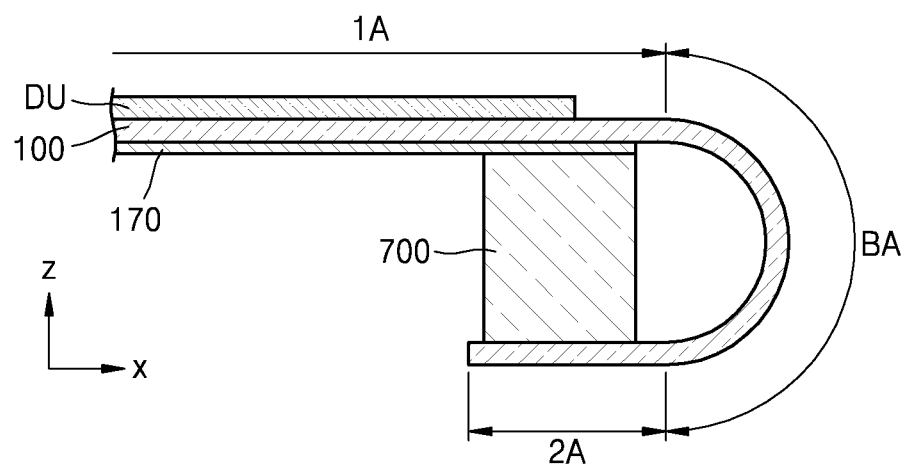
FIG. 14 is a schematic cross-sectional view of a part of a display apparatus according to an embodiment of the present disclosure.

The display apparatus according to an embodiment of the present disclosure may include, for example, the substrate 100, the display unit DU, the lower protective film 170, and a support layer 700 as shown in FIG. 14.

The substrate 100 may include the bent area BA between the first area 1A and the second area 2A as described above, and the bent area BA may be bent around the bending axis BAX. Accordingly, a part of the lower surface of the first area 1A in the substrate 100 and at least a part of the lower surface of the second area 2A in the substrate 100 face each other.

The display unit DU is on the upper surface of the substrate 100 within the first area 1A. The display unit DU may include the thin film transistor 210 and the display device 300 (as described above with reference to FIGS. 5 to 7), and moreover, the display unit DU may further include the encapsulation layer 400, the OCA 510, and/or the polarization plate 520.

The lower protective film 170 is on the lower surface of the substrate 100 to correspond at least partially to the first area 1A. In some embodiments, the support layer 700 is between the lower protective film 170 and the lower surface of the second area 2A in the substrate 100. The support layer 700 may include a metal (such as stainless steel) and/or a synthetic resin having elasticity. As described above, the lower protective film 170 may not exist in the bent area BA and the second area 2A. The support layer 700 may be attached to the lower protective film 170, and may also be attached to the lower surface of the second area 2A in the substrate 100. In some embodiments, additional layers may be between the lower protective film 170 and the support layer 700.

Figure 15:
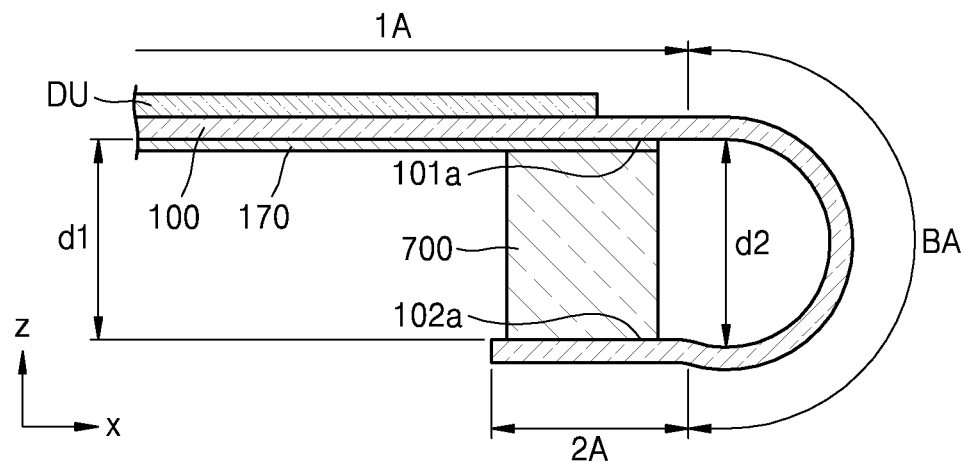
FIG. 15 is a schematic cross-sectional view of a part of a display apparatus according to an embodiment of the present disclosure.

The substrate 100 may be smoothly bent in the bent area BA (as shown in FIG. 14), and to do this, the substrate 100 needs to have a sufficient or suitable strength. However, when the substrate 100 has this sufficient strength, the substrate 100 may be damaged during bending. Therefore, the substrate 100 needs to have excellent flexibility or bending properties at least in the bent area BA. In this case, as shown in FIG. 15, which is a schematic cross-sectional view of part of a display apparatus according to an embodiment of the present disclosure, the substrate 100 may be deformed in the bent area BA.

In more detail, recognizing that a portion of the substrate 100 in the first area 1A where the support layer 700 is located has a first lower surface 101*a*, and a portion the substrate 100 in the second area 2A where the support layer 700 is located has a second lower surface 102*a*, a distance d1 between the first lower surface 101*a* and the second lower surface 102*a* may be less than a distance d2 between the parts of the first lower surface 101*a* and the second lower surface 102*a* facing each other in the lower surface of the substrate 100 (e.g., at the edges of the bent area adjacent to areas 1A and 2A).

Since the lower protective film 170 is attached to the support layer 700 in the first area 1A of the substrate 100 and the second lower surface 102*a* is attached to the support layer 700 in the second area 2A of the substrate 100, the distance d1 has a fixed value. However, using a separate element for fixing the location of the bent area BA of the substrate 100, the bent area BA may be transformed by a recovery force that may recover the substrate 100 to a status before the substrate 100 is bent. Accordingly, the maximum distance d2 between the facing portions of the substrate 100 in a part of the substrate 100 between the first lower surface 101a and the second lower surface 102a may be greater than the distance d1 between the first lower surface 101a and the second lower surface 102a.

In this case, a first virtual plane including the upper surface of the substrate 100 corresponding to the support layer 700 within the second area 2A may be taken into account. The first virtual plane may be parallel to the x-y plane. Here, as shown in FIG. 15, a part of the upper surface of the substrate 100 between a first upper surface of the first area 1A of the substrate 100 corresponding to the support layer 700 and a second upper surface of the second area 2A of the substrate 100 corresponding to the support layer 700 may protrude past the first virtual plane in a direction opposite to the direction toward the display unit DU (e.g., along the −z direction). For example, the substrate 100 may be downwardly convex (e.g., perpendicular or normal to the −z direction) at the bent area BA adjacent to the second area 2A.

The part of the bent area BA adjacent to the first area 1A may be directly and/or indirectly supported by the first area 1A that is large in area, whereas the part of the bent area BA adjacent to the second area 2A may be directly and/or indirectly supported by the second area 2A that is relatively small in area. Accordingly, the substrate 100 may be downwardly convex (e.g., perpendicular or normal to the −z direction) at the bent area BA adjacent to the second area 2A.

Figure 16:
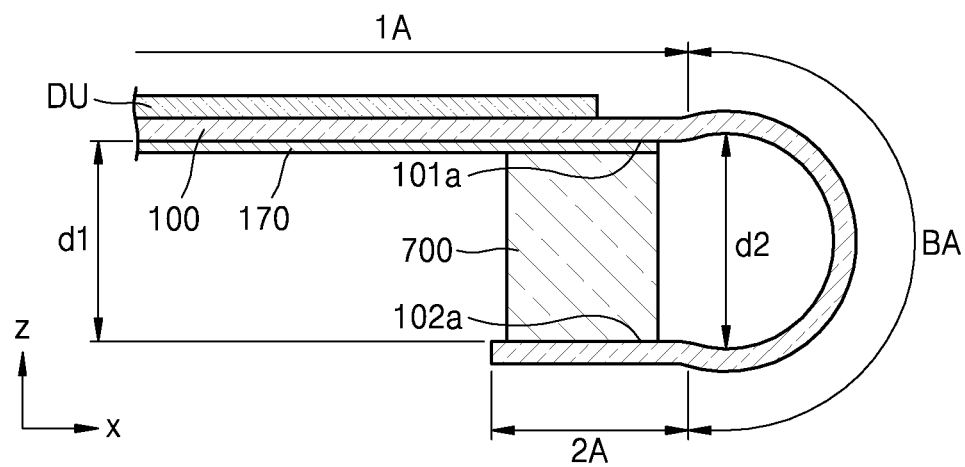
FIG. 16 is a schematic cross-sectional view of a part of a display apparatus according to an embodiment of the present disclosure.

Moreover, as shown in FIG. 16, which is a schematic cross-sectional view of a part of a display apparatus according to an embodiment of the present disclosure, another part of the upper surface of the substrate 100 between the first upper surface and the second upper surface may protrude past a second virtual plane in a direction toward the display unit DU (e.g., along the +z direction), wherein the second virtual plane may be parallel to the x-y plane and may include the upper surface of the substrate 100 corresponding to where the surface the display unit DU is formed.

Figure 17:
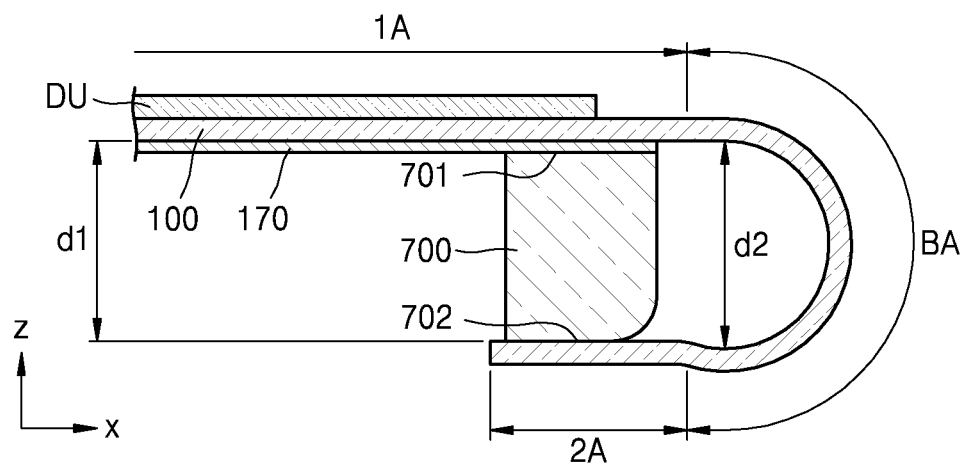
FIG. 17 is a schematic cross-sectional view of a part of a display apparatus according to an embodiment of the present disclosure.

FIG. 17 is a schematic cross-sectional view of a part of a display apparatus according to an embodiment of the present disclosure. In the display apparatus according to the embodiment of the present disclosure, the support layer 700 includes a surface 701 in a direction toward (e.g., directly facing) the lower protective film 170 and a surface 702 in a direction toward (e.g., directly facing) the second area 2A of the substrate 100, wherein the surface 701 and the surface 702 have areas that are different from each other. In more detail, the surface 701 of the support layer 700 facing the lower protective film 170 may have a greater area than the surface 702 of the support layer 700 facing the second area 2A of the substrate 100.

In this case, the substrate 100 between the first area 1A in the substrate 100 corresponding to the support layer 700 and the second area 2A in the substrate 100 corresponding to the support layer 700 may protrude past the first virtual plane in the direction opposite the display unit DU (e.g., along the −z direction). For example, the substrate 100 may be downwardly convex (e.g., along the −z direction) in the bent area BA adjacent to the second area 2A. However, protrusion of the substrate 100 in the direction toward the display unit DU (e.g., along the +z direction) in the bent area BA adjacent to the first area 1A may be prevented or reduced. When the area of the surface 701 of the support layer 700 facing the lower protective film 170 is greater than the area of the surface 702 of the support layer 700 facing the second area 2A of the substrate 100, deformation of the bent area BA adjacent to the first area 1A may be prevented or reduced.

Figure 18:
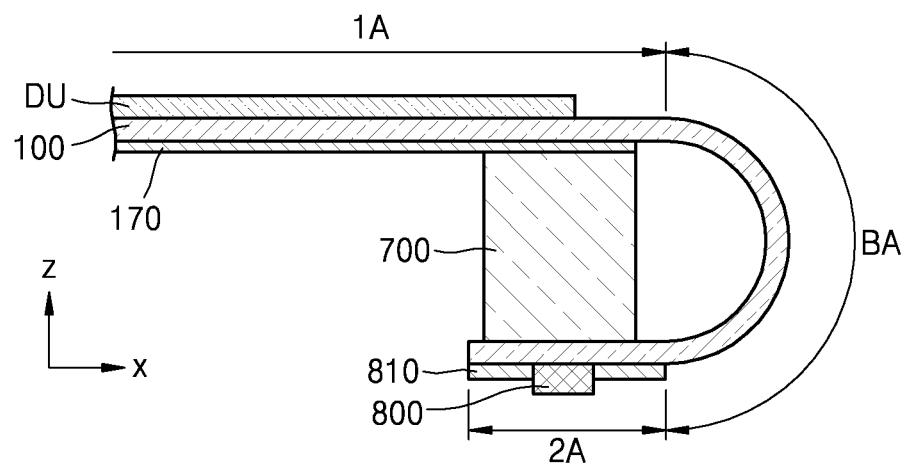
FIG. 18 is a schematic cross-sectional view of a part of a display apparatus according to an embodiment of the present disclosure.

FIG. 18 is a schematic cross-sectional view of a part of a display apparatus according to an embodiment of the present disclosure. As shown in FIG. 18, the display apparatus according to the embodiment of the present disclosure further includes an electronic device 800 on the second upper surface of the substrate 100 in the second area 2A corresponding to the support layer 700. The electronic device 800 may include an integrated circuit for controlling electric signals that are to be applied to the display unit DU and/or an integrated circuit for receiving electric signals from outside and converting the electric signals to the electric signals to be applied to the display unit DU.

The display apparatus according to the embodiment of the present disclosure may include a reinforcing film 810 on the second upper surface adjacent to the electronic device 800. The reinforcing film 810 may prevent or reduce deformation of the substrate 100, which may occur in the second area 2A. Since the second area 2A in the substrate 100 corresponds to the edge of the substrate 100 as shown in FIG. 18, the second area 2A may be deformed. However, when the reinforcing film 810 is on the second area 2A, the deformation of the second area 2A may be effectively prevented or reduced. Moreover, in order to increase the deformation prevention or reduction effect, the reinforcing film 810 may cover all or substantially all of the exposed part of the second upper surface around the electronic device 800. In some embodiments, the SNL 600 shown in FIG. 7 may extend to the edge of the substrate 100 so as to at least partially cover the reinforcing film 810.

According to one or more embodiments of the present disclosure, the method of manufacturing the display apparatus and the display apparatus capable of reducing the defect rate during manufacturing while reducing manufacturing costs may be implemented. However, the scope of the present disclosure is not limited by the above effects.

It should be understood that embodiments described herein should be considered in a descriptive sense only and not for purposes of limitation. Descriptions of features or aspects within each embodiment should typically be considered as being available for other similar features or aspects in other embodiments.

As used herein, the terms "use", "using", and "used" may be considered synonymous with the terms "utilize", "utilizing", and "utilized", respectively. Further, the use of "may" when describing embodiments of the present disclosure refers to "one or more embodiments of the present disclosure".

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While one or more embodiments have been described with reference to the drawings, it will be understood by those of ordinary skill in the art that various changes in form and details may be made therein without departing from the spirit and scope as defined by the following claims and equivalents thereof.

What is claimed is:

1. A display apparatus comprising:
a substrate having an outer surface and an inner surface and comprising a bent area between a first area and a second area,
the first area and the second area each being planar, and the bent area having a curvature,
the first area, the bent area, and the second area being contiguous, and
the inner surface of the substrate in the first area and the inner surface of the substrate in the second area at least partially facing each other;
a display unit on the outer surface of the substrate in the first area;
a lower protective film on the inner surface of the substrate in at least a part of the first area;
a support layer between the lower protective film in the first area and the inner surface of the substrate in the second area; and
a reinforcing film on the outer surface of the substrate in the second area, but not on the outer surface of the substrate in the first area and not on the outer surface of the substrate in the bent area,
wherein a first surface of the support layer is adhered to the lower protective film in the first area, and a second surface of the support layer opposite the first surface is directly adhered to the inner surface of the substrate in the second area.

2. The display apparatus of claim 1, wherein a part of the outer surface of the substrate in the bent area protrudes past a first virtual plane including the outer surface of the substrate where the display unit is located within the first area, in a direction toward the display unit.

3. The display apparatus of claim 1, wherein a distance between the inner surface of the substrate in the first area where the support layer is located and the inner surface of the substrate in the second area where the support layer is located is less than a maximum distance between facing portions of the inner surface of the substrate in the bent area.

4. The display apparatus of claim 3, wherein a part of the outer surface of the substrate in the bent area protrudes past a second virtual plane including the outer surface of the substrate where the support layer is located within the second area, in a direction away from the display unit.

5. The display apparatus of claim 1, wherein a contact area of the first surface of the support layer with the lower protective film in the first area is different from a contact area of the second surface of the support layer with the inner surface of the substrate in the second area.

6. The display apparatus of claim 1, wherein a contact area of the first surface of the support layer with the lower protective film in the first area is greater than a contact area of the second surface of the support layer with the inner surface of the substrate in the second area.

7. The display apparatus of claim 1, further comprising:
an electronic device on a portion of the outer surface of the substrate in the second area where the support layer is located.

8. The display apparatus of claim 7, wherein the reinforcing film covers all of an exposed part of the outer surface of the substrate in the second area around the electronic device.

9. The display apparatus of claim 1, further comprising:
an adhesive between the inner surface of the substrate in the first area and the first surface of the support layer.

10. A display apparatus comprising:
a substrate having an outer surface and an inner surface and comprising a bent area between a first area and a second area, the inner surface of the substrate in the first area and the inner surface of the substrate in the second area at least partially facing each other;
a display unit on the outer surface of the substrate in the first area;
a lower protective film on the inner surface of the substrate in at least a part of the first area;
a support layer between the lower protective film in the first area and the inner surface of the substrate in the second area;
an inorganic insulating layer below the display unit and extending over the outer surface of the substrate in the first area and over the outer surface of the substrate in the second area, and having an opening so that the inorganic insulating layer is not present over the outer surface of the substrate in the bent area; and
an organic material layer directly within the opening with no elements therebetween,
wherein a first surface of the support layer is adhered to the lower protective film in the first area, and a second surface of the support layer opposite the first surface is directly adhered to the inner surface of the substrate in the second area.

11. The display apparatus of claim 10, wherein the organic material layer has an uneven surface.

12. The display apparatus of claim 10, further comprising:
a first conductive layer on the organic material layer, the first conductive layer extending from the first area toward the second area through the bent area.

13. The display apparatus of claim 10, further comprising:
a stress neutralization layer over the organic material layer.

14. The display apparatus of claim 10, further comprising:
a reinforcing film on the outer surface of the substrate in the second area, but not on the outer surface of the substrate in the first area or the bent area.

15. The display apparatus of claim 14, further comprising:
an electronic device on a portion of the outer surface of the substrate in the second area where the support layer is located.

16. The display apparatus of claim 15, wherein the reinforcing film covers all of an exposed part of the outer surface of the substrate in the second area around the electronic device.

17. The display apparatus of claim 10, wherein a part of the outer surface of the substrate in the bent area protrudes past a first virtual plane including the outer surface of the substrate where the display unit is located within the first area, in a direction toward the display unit.

18. The display apparatus of claim 10, wherein a distance between the inner surface of the substrate in the first area where the support layer is located and the inner surface of the substrate in the second area where the support layer is located is less than a maximum distance between facing portions of the inner surface of the substrate in the bent area.

19. The display apparatus of claim 18, wherein a part of the outer surface of the substrate in the bent area protrudes past a second virtual plane including the outer surface of the substrate where the support layer is located within the second area, in a direction away from the display unit.

20. The display apparatus of claim 10, wherein a contact area of the first surface of the support layer with the lower protective film in the first area is different from a contact area of the second surface of the support layer with the inner surface of the substrate in the second area.

21. The display apparatus of claim 10, wherein a contact area of the first surface of the support layer with the lower protective film in the first area is greater than a contact area of the second surface of the support layer with the inner surface of the substrate in the second area.

22. The display apparatus of claim 10, further comprising:
an adhesive between the inner surface of the substrate in the first area and the first surface of the support layer.

* * * * *